(12) United States Patent
Kim

(10) Patent No.: US 7,852,166 B2
(45) Date of Patent: Dec. 14, 2010

(54) RELAXATION OSCILLATOR FOR COMPENSATING SYSTEM DELAY

(75) Inventor: Eui-Seung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 235 days.

(21) Appl. No.: 12/288,512

(22) Filed: Oct. 21, 2008

(65) Prior Publication Data

US 2009/0108948 A1 Apr. 30, 2009

(30) Foreign Application Priority Data

Oct. 29, 2007 (KR) .................. 10-2007-0108957

(51) Int. Cl.
*H03B 5/24* (2006.01)
*H03K 3/02* (2006.01)
*H03K 3/023* (2006.01)
*H03K 3/0233* (2006.01)
*H03K 3/027* (2006.01)
*H03K 3/037* (2006.01)
*H03L 1/00* (2006.01)

(52) U.S. Cl. ...................... 331/143; 331/175
(58) Field of Classification Search ................. 331/111, 331/113 R, 143–145, 175
See application file for complete search history.

(56) References Cited

U.S. PATENT DOCUMENTS

| 5,508,664 | A | * | 4/1996 | Rizzo ........................ 331/111 |
| 7,034,627 | B1 | | 4/2006 | Kudari |
| 7,138,880 | B2 | | 11/2006 | Ma et al. |
| 2007/0103243 | A1 | | 5/2007 | Gong |

FOREIGN PATENT DOCUMENTS

KR 1020010040690 A 5/2001
WO WO-00-36745 A1 6/2000

* cited by examiner

*Primary Examiner*—David Mis
(74) *Attorney, Agent, or Firm*—Mills & Onello, LLP

(57) ABSTRACT

A relaxation oscillator compensates for system delay. The relaxation oscillator includes first and second input signal units that generates first and second capacitor voltages, a delay compensation unit that receives a reference voltage and the first and second capacitor voltages and that generates a compensation voltage. In certain embodiments, a voltage generating unit applies the reference voltage to the delay compensation unit, and a latch unit stores first and second comparison signals compared by the first and second input signal units and transmits a clock signal and a inverted clock signal to the first and second input signal units. The first and second input signal units compare the first and second capacitor voltages with a compensation voltage transmitted from the delay compensation unit.

12 Claims, 7 Drawing Sheets

RELAXATION OSCILLATOR FOR COMPENSATING SYSTEM DELAY

CROSS-REFERENCE TO RELATED APPLICATIONS

This U.S. non-provisional patent application claims priority under 35 U.S.C. §119 to Korean Patent Application No. 10-2007-0108957, filed on Oct. 29, 2007, the entire contents of which are incorporated herein by reference.

BACKGROUND OF THE INVENTION

Embodiments of the present invention disclosed herein relate to a relaxation oscillator, and more particularly, to a relaxation oscillator for compensating for system delay.

Oscillator circuits are commonly used in many diverse electronic fields. A resistor-capacitor (RC) oscillation circuit generally includes a control circuit coupled to a connector positioned between serial RC networks. In order to generate an oscillation signal, the control circuit alternately charges or discharges a voltage applied to a capacitor through a resistor. An oscillation frequency is determined by the time constant of the resistor-capacitor circuit configuration.

One method of forming an RC oscillator employs the well-known NE 555 timer manufactured by National Semiconductor Corporation, as a circuit that controls charging and discharging of a capacitor of an RC network. The NE 555 timer includes a set/reset (SR) flip-flop and first and second comparators. A connector positioned between serial RC networks is coupled to one input terminal of each comparator. The other input terminal of the first comparator is coupled to receive a high threshold voltage (Vh), while the other input terminal of the second comparator is coupled to receive a low threshold voltage (Vl). An output terminal of the first comparator is coupled to a set input of a flip-flop, while an output terminal of the second comparator is coupled to a reset input of the flip-flop. An output terminal of the flip-flop is coupled to the resistor of the RC network.

With respect to operation, when the first comparator sets the flip-flop and an RC oscillation signal exceeds a predetermined high threshold voltage, discharging of the voltage is initiated through the capacitor, and when the second comparator resets the flip-flop and the RC oscillation signal drops below a predetermined low threshold voltage, charging of the voltage of the capacitor is initiated. A signal generated in a capacitor through the above method oscillates between a high threshold voltage and a low threshold voltage, with the oscillation frequency determined by values of the resistor and capacitor of the RC network.

SUMMARY OF THE INVENTION

Embodiments of the present invention provide a relaxation oscillator that compensates for system delay.

In one aspect, a relaxation oscillator comprises: first and second input signal units that generate first and second capacitor voltages; and a delay compensation unit that receives a reference voltage and the first and second capacitor voltages to generate a compensation voltage, wherein the first and the second input signal units compare the first and the second capacitor voltages with the compensation voltage transmitted from the delay compensation unit.

In one embodiment, the compensation voltage is a sum of the reference voltage and a difference of the first and the second capacitor voltages and the reference voltage, respectively, when the first and the second capacitor voltages are less than the reference voltage by respectively comparing the first and the second capacitor voltages with the reference voltage.

In another embodiment, the delay compensation unit comprises: a low peak detector that outputs error currents proportional to amounts by which the first and the second capacitor voltages are lower than the reference voltage, respectively, when the first and the second capacitor voltages become less than the reference voltage by respectively comparing the first and the second capacitor voltages with the reference voltage; a compensation current generator that generates compensation currents that are the same as the error currents; and an up-stuck stopper that maintains the compensation current at a uniform level, and that generates the compensation voltage proportional to the compensation current.

In another embodiment, the relaxation oscillator further comprises a latch unit that stores first and second comparing signals output from the first and the second input signal units, and that transmits the first and the second comparing signals to the first and the second input signal units.

In another embodiment, the first input signal unit comprises: a first inverter that inverts the second comparing signal transmitted from the latch unit to generate a first inverting signal; a first capacitor that generates the first capacitor voltage by charging and discharging of the first inverting signal transmitted from the first inverter; and a first comparator that compares the first capacitor voltage and the compensation voltage.

In another embodiment, the second input signal unit comprises: a second inverter that inverts the first comparing signal transmitted from the latch unit to generate a second inverting signal; a second capacitor that generates the second capacitor voltage by charging and discharging of the second inverting signal transmitted from the second inverter; and a second comparator that compares the second capacitor voltage and the compensation voltage.

In another embodiment, the compensation voltage is a sum of the reference voltage and a difference of the reference voltage and the first capacitor voltage, when the second comparing voltage is activated.

In another embodiment, the compensation voltage is a sum of the reference voltage and a difference of the reference voltage and the second capacitor voltage, when the first comparing voltage is activated.

In another embodiment, the relaxation oscillator further comprises a voltage generating unit that applies the reference voltage to the delay compensation unit.

In another embodiment, one of the first and the second comparing signals comprises a clock signal.

In another embodiment, the latch unit comprises an RS-latch.

In another embodiment, the relaxation oscillator further comprises a common source current discharging unit that controls an amount of current flowing when the first or the second capacitor voltage is discharged, wherein the common source current discharging unit controls the amount of the current to determine a period for discharging the first and the second capacitor voltages.

BRIEF DESCRIPTION OF THE FIGURES

The accompanying figures are included to provide a further understanding of the embodiments of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
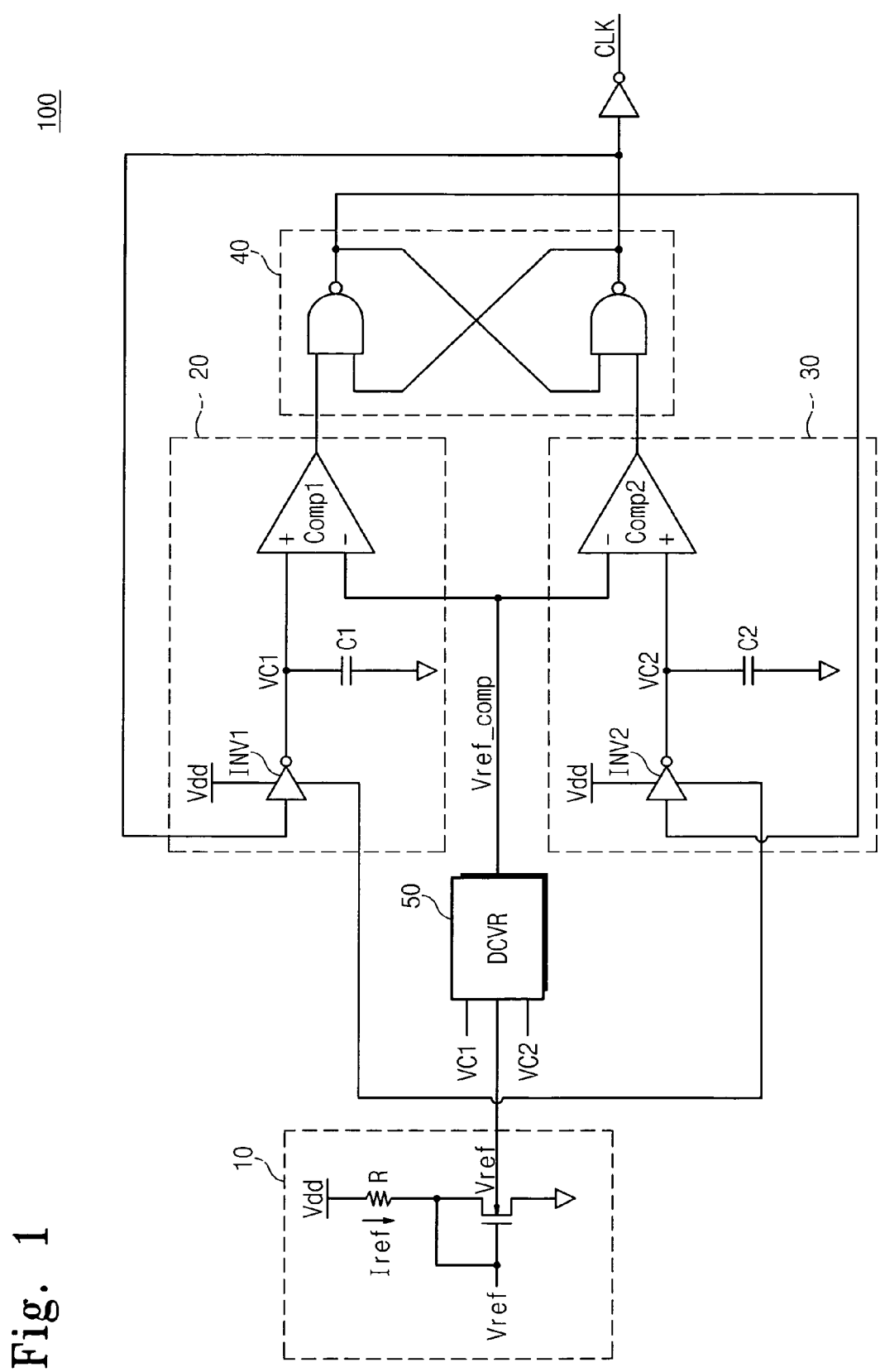
FIG. 1 is a circuit diagram of a relaxation oscillator according to an embodiment of the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

A relaxation oscillator of the present invention includes first and second input signal units generating first and second capacitor voltages; a delay compensation unit receiving a reference voltage and the first and second capacitor voltages to generate a compensation voltage; a voltage generating unit applying the reference voltage to the delay compensation unit; and a latch unit storing first and second comparison signals compared by the first and second input signal units, and transmitting a clock signal and an inverted clock signal to the first and second input signal units. The first and second input signal units compare the first and second capacitor voltages with a compensation voltage transmitted from the delay compensation unit.

FIG. 1 is a circuit diagram of a relaxation oscillator according to an embodiment of the present invention.

Referring to FIG. 1, a relaxation oscillator 100 includes a voltage generating unit 10, a first input signal unit 20, a second input signal unit 30, a latch unit 40, and a delay compensation unit 50.

The voltage generating unit 10 generates a reference voltage Vref, and provides the reference voltage Vref to the delay compensation unit 50.

The first input signal unit 20 includes a first inverter INV1 that inverts a clock signal transmitted from the latch unit 40 to generate a first inverting signal, a first capacitor C1 that generates a first capacitor voltage VC1 through charging and discharging by the first inverting signal transmitted from the first inverter INV1, and a first comparator Comp1 that compares the first inverting signal and a compensation voltage Vref_comp output by the delay compensation unit 50 to output a first comparison signal.

The second input signal unit 30 includes a second inverter INV2 that inverts an inverted clock signal transmitted from the latch unit 40 to generate a second inverting signal, a second capacitor C2 that generates a second capacitor voltage VC2 through charging and discharging by the second inverting signal transmitted from the second inverter INV2, and a second comparator Comp2 that compares the second inverting signal and the compensation voltage Vref_comp to output a second comparison signal.

The latch unit 40 transmits the clock signal and the inverted clock signal to the first and second input signal units 20 and 30. The delay compensation unit 50 compares the first and second capacitor voltages VC1, VC2 respectively with a reference voltage Vref, and outputs the compensation voltage Vref_comp that is the sum of the respective voltage differences and the reference voltage Vref.

The configuration and operation of the delay compensation unit 50 according to the present invention will be described with reference to FIG. 2.

Figure 2:
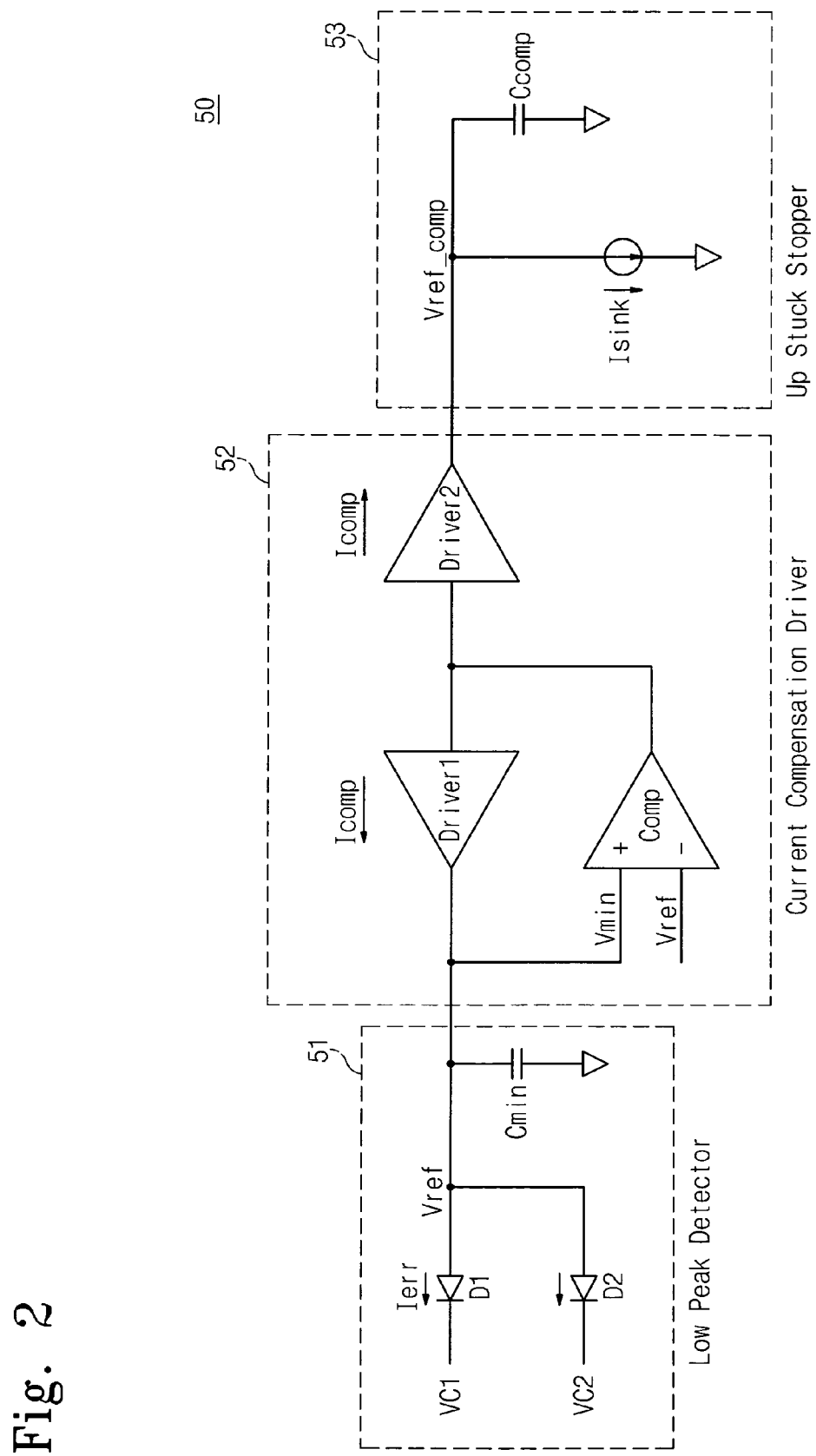
FIG. 2 is a circuit diagram of a delay compensation unit of the circuit diagram of FIG. 1.

FIG. 2 is a circuit diagram of the delay compensation unit 50 of FIG. 1.

Referring to FIGS. 1 and 2, the delay compensation unit 50 in accordance with an embodiment of the present invention includes a low peak detector 51, a current compensation driver 52, and an up-stuck stopper 53.

The low peak detector 51 compares the first and second capacitor voltages VC1 and VC2 with the reference voltage Vref, respectively, and when the first and second capacitor voltages VC1 and VC2 become less than the reference voltage Vref, the low peak detector 51 outputs error currents Ierr proportional to the differences, respectively. First and second diodes D1 and D2 are respectively connected between the first and second capacitor voltage nodes VC1 and VC2 and the reference voltage Vref.

When the reference voltage Vref becomes greater than the first or second capacitor voltage VC1 or VC2, a voltage Vmin corresponding to the difference is transferred across a capacitor Cmin to the current compensation driver 52. The current compensation driver 52 generates a compensation current Icomp equal to the error current Ierr. The current compensation driver 52 compares the reference voltage Vref with the voltage Vmin transmitted from the low peak detector 51 through a comparator Comp to generate the compensation voltage Icomp.

The up-stuck stopper 53 includes a current source that prevents an increase of the compensation current Icomp to a value greater than a predetermined value, and a compensation capacitor Ccomp that converts the compensation current Icomp to a compensation voltage Vref_comp. That is, when the compensation current Icomp rises irregularly, the up-stuck stopper 53 regulates the compensation current Icomp by flowing a current Isink of the compensation current Icomp, which is irregularly increased, to a ground source.

The compensation voltage Vref_comp is a sum of the difference between the reference voltage Vref and the first or the second capacitor voltage VC1, VC2.

Figure 3:
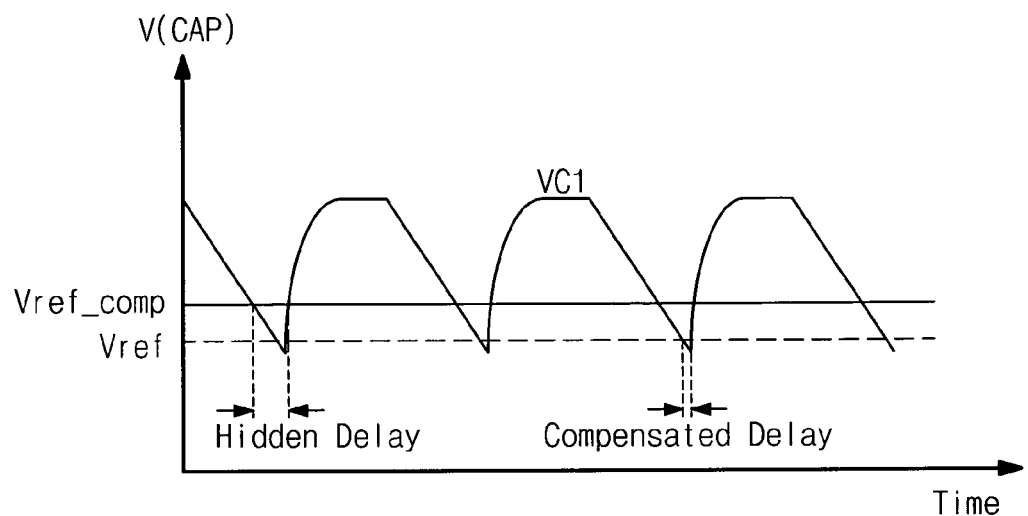
FIG. 3 is a timing diagram of the delay compensation unit of FIG. 2.

FIG. 3 is a timing diagram of the delay compensation unit of FIG. 2.

Referring to FIGS. 1 and 3, a relaxation oscillator 100 in accordance with embodiments of the present invention discharges the second capacitor C2 while the first capacitor C1 is being charged, and charges the second capacitor C2 while the first capacitor C1 is being discharged. Where T represents the period for charging and discharging the first and second capacitors C1 and C2, T/2 is the charging or discharging time of the first and second capacitor C1 and C2. The relaxation oscillator 100 operates through discharging of the first and second capacitors C1 and C2.

Charging and discharging of the first and second capacitors C1 and C2 are repetitively performed between a power supply voltage Vdd and the reference voltage Vref. "Relaxation" in the relaxation oscillator refers to discharging of the capacitors.

The relaxation oscillator 100 of embodiments of the present invention is configured to compensate for a type of delay referred to as "system delay". Specifically, in this sense, a "system delay" is the time it takes for a first comparing signal, generated when the first capacitor C1 is offset at the point when the first capacitor C1 is discharged to the reference voltage Vref, to be transferred to the second capacitor C2 via the latch unit 40. Accordingly, the first and second capacitors C1 and C2 are discharged to a voltage level that is lower than the reference voltage Vref level due to the system delay.

The period T of the relaxation oscillator 100 in accordance with an embodiment of the present invention may be expressed as Eq. 1.

$$T = 2RC + t1 + t2 + t3 + t4 \quad \text{(Eq. 1)}$$

$$\Delta t = t1 + t2 + t3 + t4 \quad \text{(Eq. 2)}$$

Eq. 2 expresses a system delay Δt of the relaxation oscillator 100. The time value t1 is the offset delays of the first and second comparators Comp1 and Comp2, t2 is the delays of the first and second comparators Comp1 and Comp2, t3 is the delays of the latch unit 40, and t4 is the delays of first and second inverters INV1 and INV2. Thus, the total system delay (Δt) is the sum of t1, t2, t3, and t4.

Continuing to refer to FIGS. 1 through 3, the first comparator Comp1 compares the compensation voltage Vref_comp with the first capacitor voltage VC1. The compensation voltage Vref_comp is the sum of a difference between the first capacitor voltage VC1 and the reference voltage, and the reference voltage Vref. That is, the compensation voltage Vref_comp has a potential equal to the reference voltage Vref, plus a difference between the first capacitor voltage VC1 and the reference voltage Vref.

A time at which an offset occurs in the first comparator Comp1 is advanced to be proportionate to the difference between the first capacitor voltage VC1 and the reference voltage Vref. That is, the first comparator Comp1 generates an offset that is pre-advanced by the total system delay time.

Accordingly, the relaxation oscillator in accordance with embodiments of the present invention operates the charging and discharging times of the first and second capacitors in consideration of the system delay, in order to compensate for the system delay.

The operation of the second comparator Comp2 is the same as that of the first comparator Comp1. Therefore, a detailed description of the operation thereof will not be repeated herein.

Figure 4:
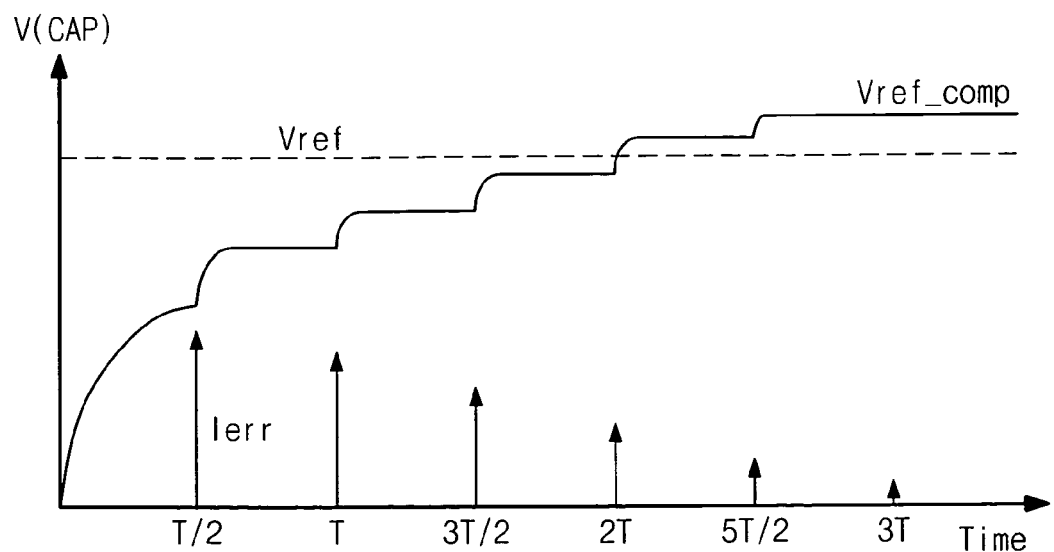
FIG. 4 is a timing diagram illustrating a compensation voltage of the delay compensation unit of FIG. 2.

FIG. 4 is a timing diagram illustrating a compensation voltage of the delay compensation unit in FIG. 2, in accordance with embodiments of the present invention.

Referring to FIGS. 1 through 4, a compensation voltage Vref_comp of a delay compensation unit 50 according to the present invention is generated through a plurality of feedback operations. That is, the first and second input signal units 20 and 30 compare the compensation voltage Vref_comp to the first and second capacitor voltages VC1 and VC2, and output first and second comparison signals. The first and second comparison signals are stored in the latch unit 40. The first and second comparison signals transmitted from the latch unit 40 are input, or fed back, to the first and second input signal units 20 and 30, and the first and second input signal units 20 and 30 compare the compensation voltage Vref_comp with the first and second capacitor voltages VC1 and VC2 again. Through this process, the compensation voltage Vref_comp can be given a potential greater than the reference voltage Vref by the difference of the first capacitor voltage VC1 and the reference voltage Vref.

Also, when the compensation voltage Vref_comprises irregularly, the up-stuck stopper 53 maintains the compensation current Icomp at a uniform level.

Figure 5:
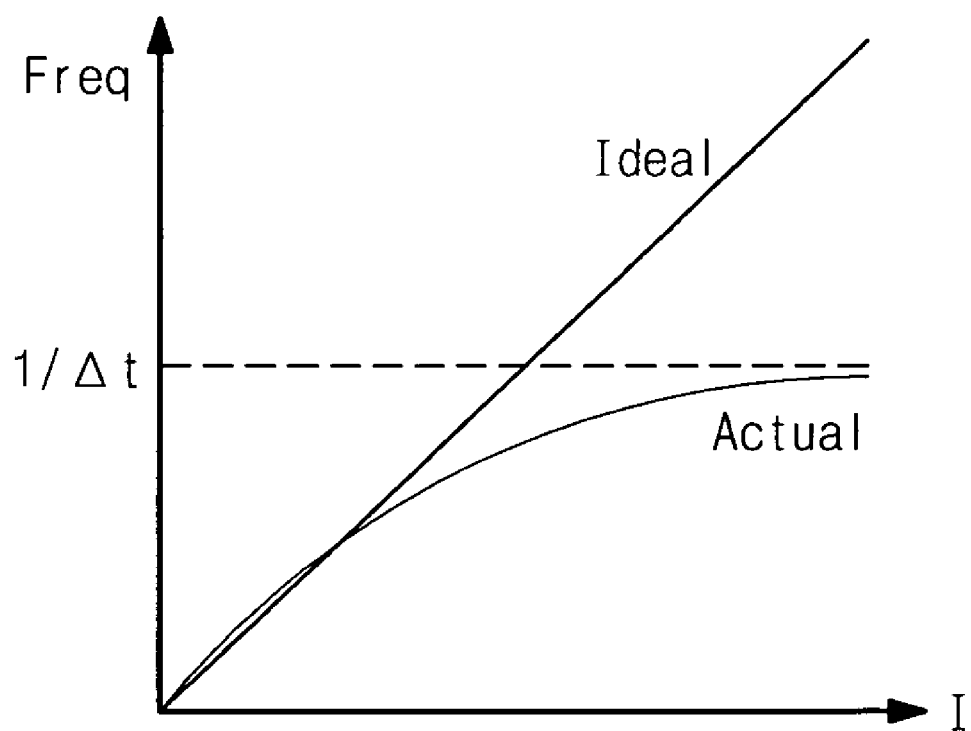
FIG. 5 is a graph illustrating a frequency curve of the relaxation oscillator of FIG. 1.

FIG. 5 is a graph illustrating a frequency curve of a relaxation oscillator of FIG. 1, in accordance with an embodiment of the present invention.

Referring to FIG. 5, there is no limit to the maximum frequency of an ideal relaxation oscillator. However, the maximum frequency of an actual relaxation oscillator is restricted by the total system delay (Δt) in Eq. 2. That is, the maximum frequency of a relaxation oscillator becomes the inverse number (1/Δt) of the system delay.

Accordingly, a relaxation oscillator 100 in accordance with embodiments of the present invention compensates for system delay to generate a clock that is close to an ideal clock. Thus, the embodiments of the present invention, through the compensation of a system delay, effectively provide an ideal relaxation oscillator.

Figure 6:
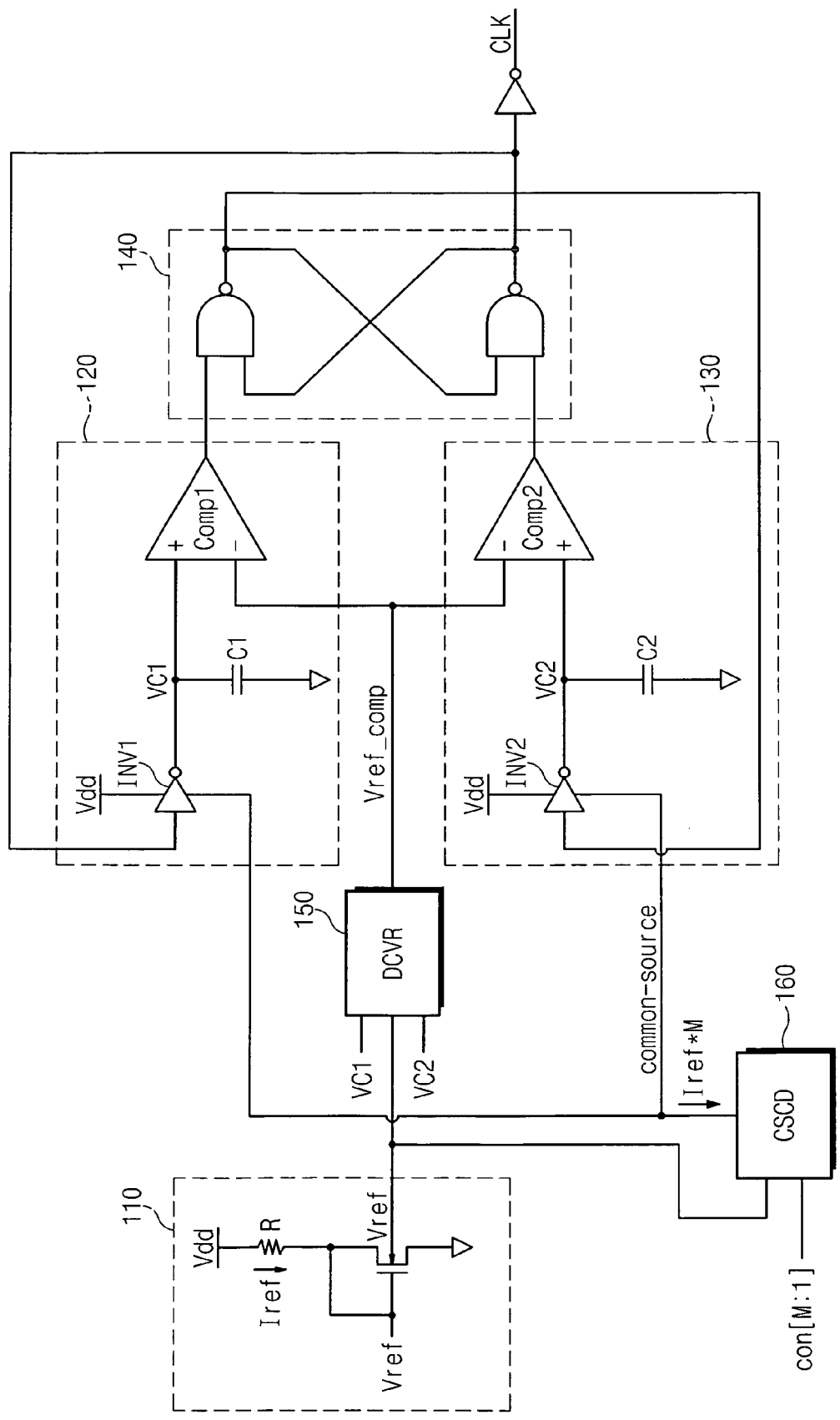
FIG. 6 is a block diagram of a relaxation oscillator according to another embodiment of the present invention.

FIG. 6 is a block diagram of a relaxation oscillator 200 according to another embodiment of the present invention.

Referring to FIG. 6, the relaxation oscillator 200 in accordance with other embodiments of the present invention includes a voltage generating unit 110, a first input signal unit 120, a second input signal unit 130, a latch unit 140, a delay compensation unit 150, and a common source current discharging unit 160.

The voltage generating unit 110 generates a reference voltage Vref, and applies the generated reference voltage Vref to the delay compensation unit 150.

The first input signal unit 120 includes a first inverter INV1 that inverts a clock signal transmitted from the latch unit 140 to generate a first inverting signal, a first capacitor C1 that generates a first capacitor voltage VC1 through charging and discharging by the first inverting signal transmitted from the first inverter INV1, and a first comparator Comp1 that compares the first inverting signal and a compensation voltage Vref_comp output by the delay compensation unit to output a first comparing signal.

The second input signal unit 130 includes a second inverter INV2 that inverts an inverted clock signal transmitted from the latch unit 140 to generate a second inverting signal, a second capacitor C2 that generates a second capacitor voltage VC2 through charging and discharging by the second inverting signal transmitted from the second inverter INV2, and a second comparator Comp2 that compares the second inverting signal and the compensation voltage Vref_comp to output a second comparing signal.

The latch unit 140 transmits the clock signal and the inverted clock signal to the first and second input signal units 120 and 130. The delay compensation unit 150 compares first and second input voltages to the reference voltage Vref, respectively, and outputs a compensation voltage Vref_comp that is the sum of the reference voltage Vref and the respective voltage differences.

The common source current discharging unit 160 controls the amount of current flowing through a common source to further control the resulting frequency of the output signal of the relaxation oscillator 200.

A delay compensating unit 150 according to the embodiment of FIG. 1 is similar in configuration and operation as that of the embodiment of FIGS. 1 and 2 above; thus a repeated description thereof will not be provided.

Figure 7:
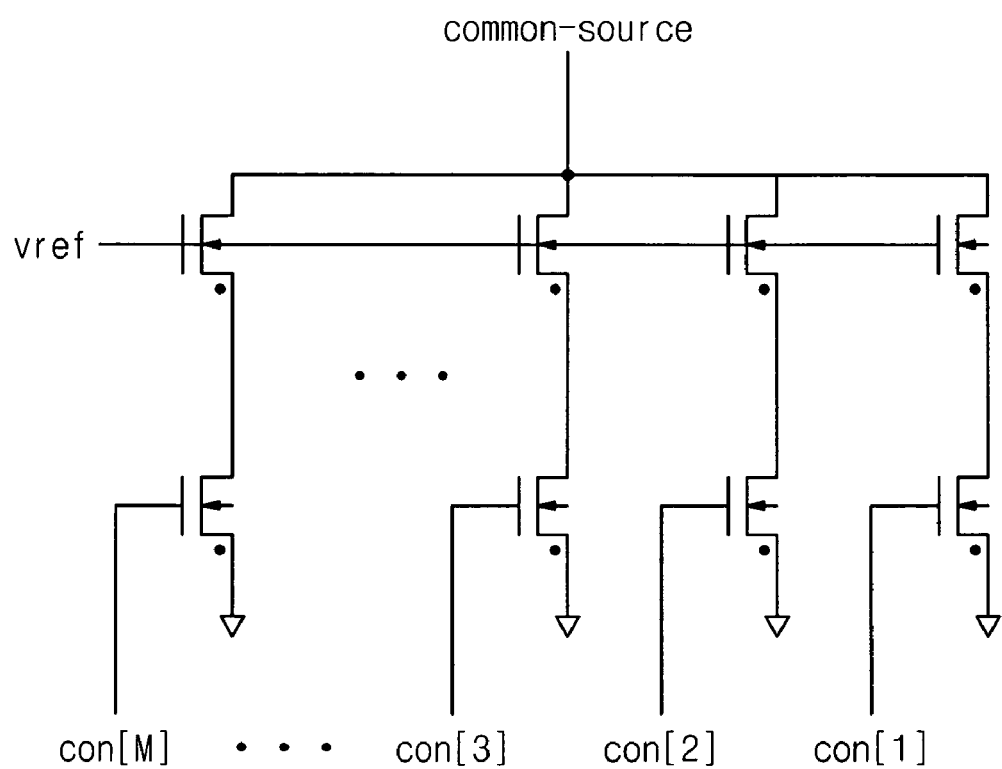
FIG. 7 is a circuit diagram illustrating a common source current discharging unit of the embodiment of FIG. 6.

FIG. 7 is a circuit diagram illustrating a common source current discharging unit in FIG. 6.

Referring to FIGS. 6 and 7, a common source current discharging unit 160 includes a first plurality of NMOS transistors connected in parallel between a common source and a ground voltage terminal. Switches, in this case, comprising a second plurality of NMOS transistors are provided on each parallel leg of the unit 160 between one of the first plurality of NMOS transistors and a ground terminal. The switches are controlled in response to control signals con[M:1]. A reference voltage Vref is applied to the gates of the first plurality of NMOS transistors.

In order to increase a discharged current by M times, the common source current discharging unit 160 of the present invention enables an M number of NMOS transistors according to the following relationships.

$$Iref = (Vdd - Vref)/R \quad \text{(Eq. 3)}$$

$$\begin{aligned}Tdelay &= 2*(C*(Vdd-Vref))/(Iref*M) \\ &= 2*(C*(Iref*R))/(Iref*M) \\ &= 2RC/M\end{aligned} \quad \text{(Eq. 4)}$$

$$\text{Frequency} = M/(2RC) \quad \text{(Eq. 5)}$$

Eq. 3 represents a current flowing through the resistor R of the voltage generating unit 110. If capacitances C of the first and second capacitors C1, C2 are the same, a period Tdelay of the relaxation oscillator 200 according to the present embodiment of the present invention can be obtained by Eq. 4. Therefore, the frequency of the relaxation oscillator 200 according to the present embodiment of the present invention is proportional to M, as represented by Eq. 5.

Figure 8:
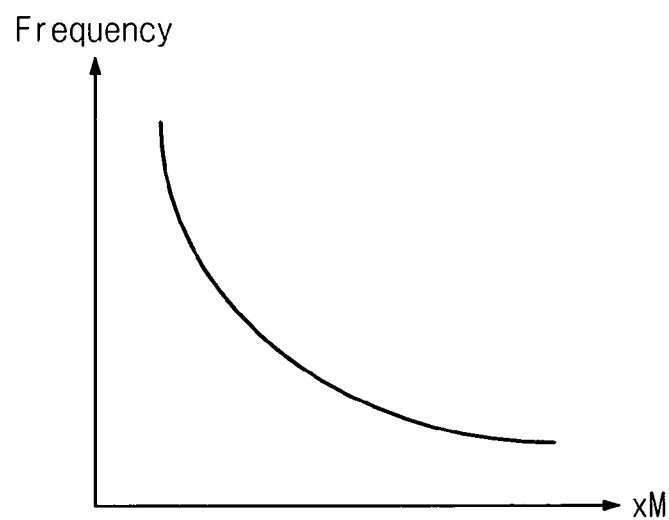
FIG. 8 is a graph illustrating frequency characteristics of a typical relaxation oscillator.
Figure 9:
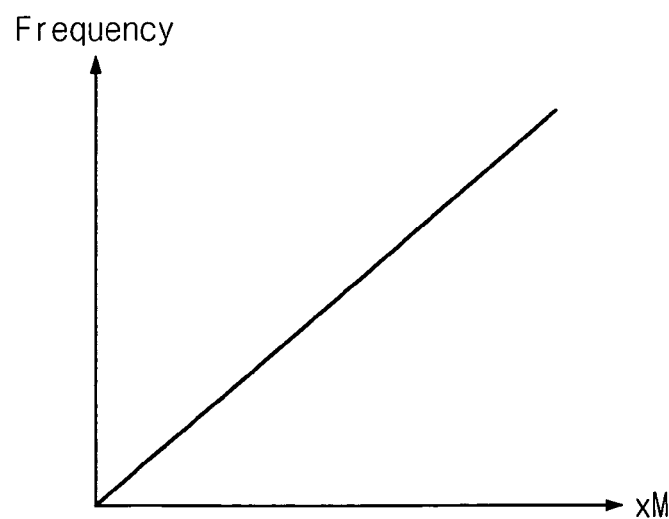
FIG. 9 is a graph illustrating frequency characteristics of the relaxation oscillator of FIG. 6, in accordance with embodiments of the present invention.

FIG. 8 is a graph illustrating frequency characteristics of a typical relaxation oscillator, and FIG. 9 is a graph illustrating frequency characteristics of the relaxation oscillator of the embodiment of FIG. 6.

Referring to FIGS. 8 and 9, in a typical relaxation oscillator, the frequency is inversely proportional to M, and it is difficult to accurately predict the frequency by controlling the value M.

However, in the relaxation oscillator according to the embodiment of the present invention, because the frequency and the value M are proportional, an accurate frequency is adjusted by controlling the value M. Accordingly, the relaxation oscillator according to the embodiment of the present invention may be used for a digital controlled oscillator (DCO) instead of a voltage controlled oscillator (VCO) of a phase lock loop (PLL).

The embodiments of the present invention described herein have the effect of providing a relaxation oscillator for compensating for system delay.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A relaxation oscillator comprising:
   first and second input signal units that generate first and second capacitor voltages; and
   a delay compensation unit that receives a reference voltage and the first and second capacitor voltages to generate a compensation voltage,
   wherein the first and the second input signal units compare the first and the second capacitor voltages with the compensation voltage transmitted from the delay compensation unit.

2. The relaxation oscillator of claim 1, wherein the compensation voltage is a sum of the reference voltage and a difference of the first and the second capacitor voltages and the reference voltage, respectively, when the first and the second capacitor voltages are less than the reference voltage by respectively comparing the first and the second capacitor voltages with the reference voltage.

3. The relaxation oscillator of claim 1, wherein the delay compensation unit comprises:
   a low peak detector that outputs error currents proportional to amounts by which the first and the second capacitor voltages are lower than the reference voltage, respectively, when the first and the second capacitor voltages become less than the reference voltage by respectively comparing the first and the second capacitor voltages with the reference voltage;
   a compensation current generator that generates compensation currents that are the same as the error currents; and
   an up-stuck stopper that maintains the compensation current at a uniform level, and that generates the compensation voltage proportional to the compensation current.

4. The relaxation oscillator of claim 1, further comprising a latch unit that stores first and second comparing signals output from the first and the second input signal units, and that transmits the first and the second comparing signals to the first and the second input signal units.

5. The relaxation oscillator of claim 4, wherein the first input signal unit comprises:
   a first inverter that inverts the second comparing signal transmitted from the latch unit to generate a first inverting signal;
   a first capacitor that generates the first capacitor voltage by charging and discharging of the first inverting signal transmitted from the first inverter; and
   a first comparator that compares the first capacitor voltage and the compensation voltage.

6. The relaxation oscillator of claim 4, wherein the second input signal unit comprises:
   a second inverter that inverts the first comparing signal transmitted from the latch unit to generate a second inverting signal;
   a second capacitor that generates the second capacitor voltage by charging and discharging of the second inverting signal transmitted from the second inverter; and
   a second comparator that compares the second capacitor voltage and the compensation voltage.

7. The relaxation oscillator of claim 4, wherein the compensation voltage is a sum of the reference voltage and a difference of the reference voltage and the first capacitor voltage, when the second comparing voltage is activated.

8. The relaxation oscillator of claim 4, wherein the compensation voltage is a sum of the reference voltage and a difference of the reference voltage and the second capacitor voltage, when the first comparing voltage is activated.

9. The relaxation oscillator of claim 1, further comprising a voltage generating unit that applies the reference voltage to the delay compensation unit.

10. The relaxation oscillator of claim 4, wherein one of the first and the second comparing signals comprises a clock signal.

11. The relaxation oscillator of claim 4, wherein the latch unit comprises an RS-latch.

12. The relaxation oscillator of claim 1, further comprising a common source current discharging unit that controls an amount of current flowing when the first or the second capacitor voltage is discharged,
   wherein the common source current discharging unit controls the amount of the current to determine a period for discharging the first and the second capacitor voltages.

* * * * *